(12) United States Patent
Salling et al.

(10) Patent No.: US 7,187,530 B2
(45) Date of Patent: Mar. 6, 2007

(54) ELECTROSTATIC DISCHARGE PROTECTION CIRCUIT

(75) Inventors: Craig Thomas Salling, Cupertino, CA (US); Siak Chon Kee, Milpitas, CA (US); Pierre Dermy, Nevada City, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 417 days.

(21) Appl. No.: 10/358,451

(22) Filed: Feb. 4, 2003

(65) Prior Publication Data

US 2004/0125521 A1 Jul. 1, 2004

Related U.S. Application Data

(60) Provisional application No. 60/436,699, filed on Dec. 27, 2002.

(51) Int. Cl.
*H02H 9/00* (2006.01)
(52) U.S. Cl. .......................... 361/111; 361/56
(58) Field of Classification Search ............ 361/56–58, 361/91.1, 110, 111; 257/355
See application file for complete search history.

(56) References Cited

U.S. PATENT DOCUMENTS

| | | | |
|---|---|---|---|
| 5,255,146 A | | 10/1993 | Miller |
| 5,745,323 A | * | 4/1998 | English et al. ................. 361/56 |
| 5,852,541 A | * | 12/1998 | Lin et al. ...................... 361/111 |
| 6,016,070 A | * | 1/2000 | Uehara ......................... 327/176 |
| 6,566,715 B1 | * | 5/2003 | Ker et al. ..................... 257/355 |
| 6,624,992 B1 | * | 9/2003 | Aparin ......................... 361/56 |
| 6,690,555 B1 | * | 2/2004 | Pasqualini .................... 361/56 |

OTHER PUBLICATIONS

ESD Design Methodology; by Richard Merrill, Enayet Issaq; *EOS/ESD Symposium 93;* 1993; pp. 233-237 (5 pages).
Sub-Micron Chip ESD Protection Schemes Which Avoid Avalanching Junctions; by E. R. Worley, et al.; *EOS/ESD Symposium 95;* 1995; pp. 13-20 (8 pages).
Modular, Portable, and Easily Simulated ESD Protection Networks for Advanced CMOS Technologies; by Cynthia A. Torres, et al.; *EOS/ESD Symposium 2001;* 2001; 14 pages (page numbers unknown).
ESD Protection Methodology; *Basic ESD and I/O Design;* by Sanjay Dabral, Timothy Maloney; Wiley 1998; pp. 44-71 (14 pages).

* cited by examiner

*Primary Examiner*—Brian Sircus
*Assistant Examiner*—Danny Nguyen
(74) *Attorney, Agent, or Firm*—Fields IP, PS

(57) ABSTRACT

An electrostatic discharge protective circuit may comprise a low-pass filter and a high-pass filter to receive and filter signals of a supply line. Control logic may receive output signals of the low-pass and high-pass filters and may operate a gateable channel to shunt current of the supply line dependent on the output signals from the filters.

25 Claims, 8 Drawing Sheets

ELECTROSTATIC DISCHARGE PROTECTION CIRCUIT

REFERENCE TO RELATED APPLICATION

This application claims benefit and priority to Provisional Application Ser. No. 60/436,699, filed Dec. 27, 2002 and entitled ELECTROSTATIC DISCHARGE PROTECTION CIRCUIT, the disclosure of which is hereby incorporated by reference in its entirety.

BACKGROUND

The present disclosure is related to protection circuits and more particularly to semiconductor devices and integrated circuits with electrostatic protection circuits.

Integrated circuits may be used in a variety of applications such as memory, controllers, networking, processing, display, interfacing and other types of applications. Conventionally, integrated circuits may include known circuits to protect them from electrostatic discharge damage. Such a protective circuit may be referenced as an ESD protection circuit.

ESD protective circuits may be disposed at each pad of an integrated circuit. For example, an I/O pad may include clamp devices that may clamp excessive signal levels to supply busses. The supply busses, in-turn, may also comprise conventional by-pass circuits operable to shunt excessive supply signals to other supply lines of the integrated circuit. With such circuits, an excessive level from an ESD event may be shunted to other regions of the integrated circuit and may diffuse the voltage build-up and protect the integrated circuit from any damage.

As the dimensions of semiconductor devices (e.g., MOSFETs) decrease, they may become more vulnerable to ESD. Accordingly, manufactures strive to improve the reliability of these circuits and may additionally strive to enhance the sensitivity of the protective circuits. Additionally, with the reduced geometries, the level of integration for the integrated circuits may increase. These increased levels of integration may result in semiconductor devices having a greater number of interfacing pads—e.g., I/O pads, supply pads, control pads, etc.—to interface the various signals to/from the device. With such increase in the number of interfacing pads, the number of ESD circuits may similarly increase.

SUMMARY

In accordance with an embodiment of the present invention, an electrostatic discharge (ESD) protection circuit may discern a non-ESD event from an ESD event and disable a shunting device when determining a non-ESD event.

In accordance with one embodiment, an ESD protection circuit may comprise a gateable channel disposed between a first and second supply buses. A first conditioning circuit may receive a signal of the first bus and condition it in accordance with a first transfer function to provide a first output signal. A second conditioning circuit may receive a signal of the first supply bus and condition the signal using a second transfer function different from the first to provide a second output signal. Logic circuitry may receive the first and second output signals and operate the gateable channel dependent on the first and second output signals.

In a further embodiment, the first and second conditioning circuits may comprise low and high pass filters respectively.

The logic circuitry may enable the gateable channel when distinguishing an ESD event when receiving a high level from the high pass filter and not a high level from the low pass filter.

In another embodiment, the gateable channel may comprise an N-channel MOSFET. The logic circuitry may comprise an inverter to drive the gate of the N-channel MOSFET. A NAND gate may be used to drive an input of the inverter. One input of the NAND gate may receive the output signal of the high-pass filter and another input of the NAND gate may receive the output signal of the low-pass filter via an inverter.

In another embodiment, an integrated circuit may comprise a plurality of pads. First and second supply busses may be coupled to first and second pads respectively of the plurality. A switch may be operable to selectably short the first supply bus to the second supply bus dependent on a control signal. A discrimination circuit may discern an ESD event from non-ESD events and may enable the selectable switch dependent on such discernment. In a further embodiment, the plurality of pads may comprise multiple I/O circuits. Each I/O circuit may comprise an I/O pad of the plurality of pads, and first and second clamping diodes between the I/O pad and the first and second supply busses respectively. Each I/O circuit may further comprise one each of the above switch and discrimination circuit.

In another embodiment, a method of operating a semiconductor device may comprise monitoring a signal of a supply line to determine an ESD events and non-ESD events. Upon determining an ESD event, current of the supply line may be shunted.

BRIEF DESCRIPTION OF THE DRAWINGS

Subject matter of embodiments of the present invention and methods of operation may be further understood by reference to the following detailed description when read with reference to the accompanying drawings, in which.

DESCRIPTION OF EMBODIMENTS

In the following description, numerous specific details may be set forth to provide an understanding of exemplary embodiments of the present invention. It will be understood, however, that alternative embodiments may comprise sub-combinations of the disclosed examples.

Additionally, readily established circuits of the exemplary embodiments may be disclosed in simplified form (e.g., simplified block diagrams and/or simplified description) to avoid obscuring an understanding of the embodiments with excess detail. Likewise, to aid a clear and precise disclosure, description of known operations—e.g., low-pass filtering, high-pass filtering, logic enabling, logic thresholds, etc.— may similarly be simplified where persons of ordinary skill in this art can readily understand operation by way of the drawings and surrounding disclosure.

As used herein, "semiconductor device" may reference a substrate that may have one or more layers of material formed on or within the substrate. These layers may be patterned and doped to produce various devices (e.g., transistors, diodes, capacitors, interconnects, etc.) for an integration of circuitry. When referencing this integration of circuitry, therefore, it may be described as integrated together, on or within the semiconductor device.

Furthermore, those skilled in the art will recognize that although an example of the present invention may reference an N-type MOS transistor relative to a given polarity of operation; the dopant type(s) of the transistor and its polarity of operation may be reversed to provide complimentary circuits and operation.

Figure 1A:
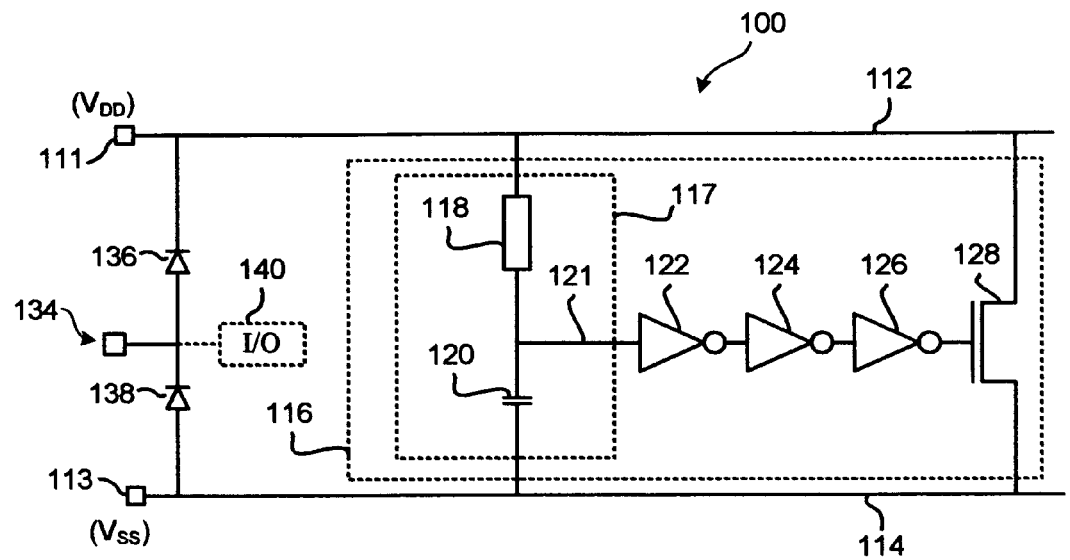
FIG. 1A is a schematic of a conventional ESD protection circuit between two supply lines.
Figure 1B:
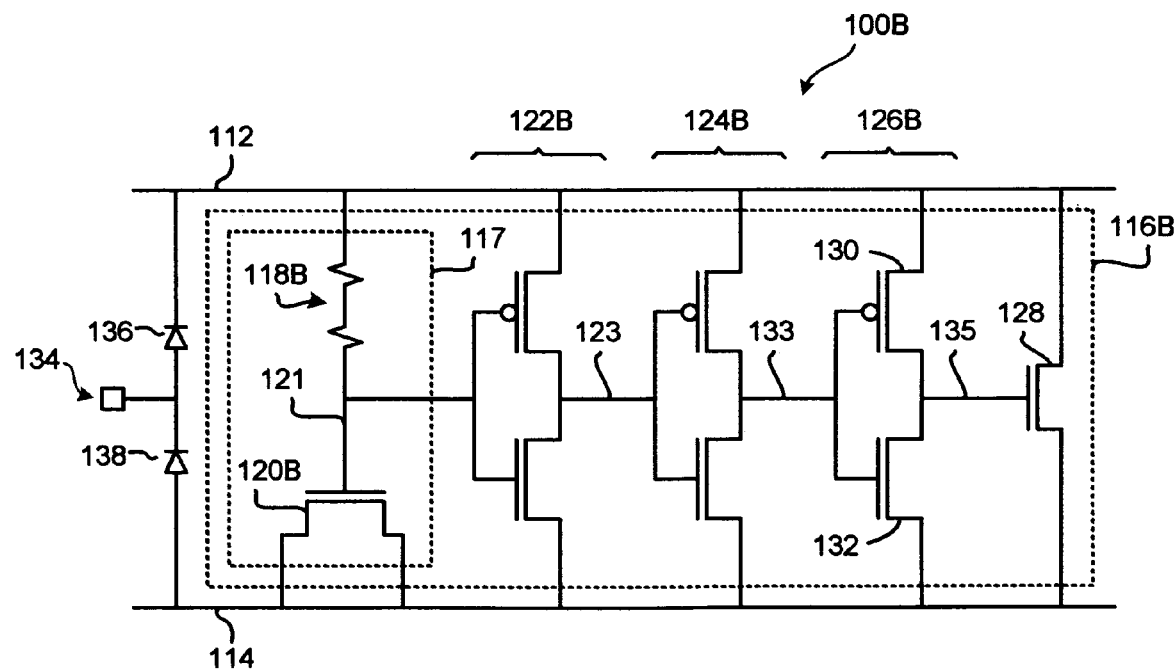
FIG. 1B is schematic a conventional ESD protection circuit associated with an I/O interface.

Referencing FIGS. 1A and 1B, a conventional I/O circuit 100 may comprise an I/O pad 134 coupled to internal circuitry 140. The internal circuitry of the semiconductor device may be of a larger system and/or integrated circuit. For example, the I/O pad may channel a signal to/from a receiver and/or driver circuit(s).

Clamping devices 136, 138, may serve to protect internal circuits 140 of the integrated circuit from, e.g., excessive transients such as an ESD event, by clamping transients of input/output pad 134. Diode 136 may be disposed with its anode coupled to I/O pad 134 and its cathode coupled to upper bus 112. In operation, this diode may conduct current when a voltage of the I/O pad may exceed the upper supply, e.g., the voltage of a VDD bus. The diode may then shunt current from the I/O pad to the upper bus.

Conversely, diode 138 may be disposed with its anode coupled to the lower bus and its cathode coupled to the I/O pad. This diode 138 may conduct current when the voltage of the I/O pad drops below a level of the lower bus 114. It may be understood that the I/O pad may be coupled to other circuitry 140.

Another conventional ESD protection circuit 116 may be operable to short a first bus 112 to a second bus 114 when a voltage transient of the first (e.g., Vdd bus) should exceed predetermined threshold relative to the second. In this example, the ESD protection circuit 116 may be disposed between, e.g., an upper supply (Vdd) bus and a lower supply (Vss) bus. When a voltage spike of the upper bus should exceed a given ramp-rate and voltage threshold, this conventional ESD circuit may enable MOSFET 128.

Further referencing FIGS. 1A and 1B, the I/O circuit 100/100B may comprise an ESD protection circuit 116/116B with filter 117 operable to filter a signal of the upper supply in accordance with a low-pass frequency response to obtain an output signal for driving inverter 122. In such embodiment, resistive device 118/118B may be disposed in series with capacitor 120. The filter's output node 121, i.e. intermediate the resistor and capacitor, may propagate the filter's output signal to inverter 122—i.e., the first of inverter chain 122,124,126.

In this conventional circuit 116, further referencing FIG. 1B, the inverters comprise P-channel and N-channel devices 130,132 (i.e., P-MOSFET and N-MOSFET) disposed in series arrangement between upper and lower buses 112,114.

In this example, the source of P-MOSFET 130 may be coupled to upper bus 112 and the source of N-MOSFET 132 may be coupled to lower bus 114. The drains of the MOSFETs may be coupled together to serve as an output. The output of the first inverter 122B may drive the input of second inverter 124B, while the output of the second inverter may drive the input of the third inverter 126. The last inverter 126B may drive control terminal 135 of shunting device 128—i.e., the gate of an N-channel MOSFET.

The gates of the MOSFETs 130,132 may be coupled together as the inputs to respective inverters. The input of first inverter 122B may be coupled to output 121 of filter 117. The input of the second inverter 124B may be coupled to the output of the first; while the input of the third 126B may be coupled to receive the output of second inverter 124B.

During an ESD event on upper supply 112, the last inverter 126/126B may apply a voltage to the gate of N-channel MOSFET 128 to enable the MOSFET and shunt current from the upper supply to the lower supply. Additionally, however, it may be noted that certain "non-ESD" events may similarly enable the shunting device of protection circuit 100/100B.

Figure 8:
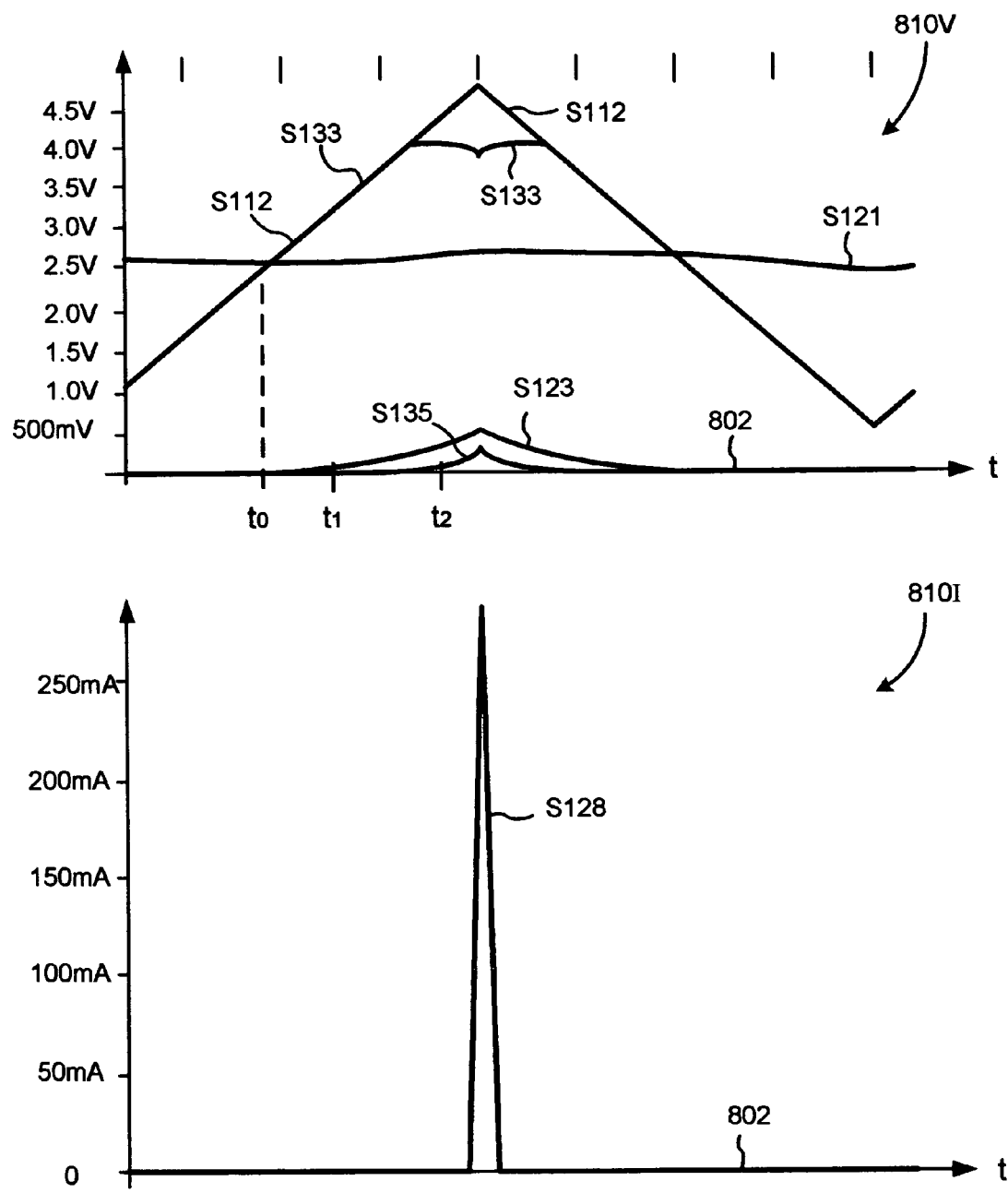
FIG. 8 includes graphs to show voltage signals and a current signal during operation of a protection circuit.

Referencing FIG. 8, a ramp-up or simultaneous switching event may present a signal increase on the upper supply. Such upwardly ramping signal may be represented by signal S112 in timing diagram 810V. When such ramp-up signal is presented on upper bus 112 (FIGS. 1A–1B), it may influence the other nodes of the circuit, which may be simulated and represented by signals S121,S123,S133 and S135 for nodes 121,123,133 and 135 respectively. If the integrated circuit is being powered-up, the input nodes of the inverters may be assumed at low levels for their initial starting bias level. Alternatively, if the integrated circuit has already been powered, it may be assumed in a steady-state powered condition with the output of inverters 122,124,128 providing levels of low, high and low respectively.

Further referencing the transient event of FIG. 8, at time t0 on the graph, nodes 121 and 133 may remain essentially unperturbed, and may hold their levels (e.g., of VDD), as represented by signals S121 and S133 respectively. Additionally, nodes 123 and 135 may hold their low levels (e.g., of VSS) as represented by signals S123 and S135 respectively. Then, the level of the upper supply may begin to ramp upwardly. During an initial period of this upward ramping of the upper supply, the PMOS device of inverter 124B may remain enabled (per the low level of S123) and may route the level of the upper supply signal S112 to its drain output at node 133. During this first duration between time t0 and t1, signal S133 may follow the upward ramp of the supply signal S112.

The output of low pass filter at node 121 presents a signal S112 that may remain close to its average value (e.g., VDD), and may be presented to the gate of the PMOS device of inverter 122B. Eventually, the difference between level of the upper supply S112 and the level of S121 may exceed the threshold for inverter 122B. At such point in time, t1, the PMOS of inverter 122B may begin to conduct and may then bias its output at node 123, as may be represented by signal S123 as it begins to ramp-upward from its lower level.

With an increase in the voltage at node 123, the NMOS device of inverter 124B may begin to conduct and may decrease the signal S133 below the level of S112. With the level of signal 133 being held as the level of S112 continues upward, eventually, the difference between S112 and S133 may reach the threshold for inverter 126B. At this point in time, the PMOS device 130 may be enabled, increasing the voltage bias (signal S135 of FIG. 8) at its output. The bias increase at control node 135 (e.g., the gate of a large NMOS device) may enable shunting device 128 for shunting current as represented by current signal S128 of FIG. 8.

In one type of noise example, such as a power-up or SSN event, supply line 112 may receive a signal comprising an upward ramp. Referencing FIGS. 6 and 8, the noise event may double the typical magnitude of the voltage on the upper supply 112. If it doubles the amplitude of the supply signal, (610C of FIG. 6), the noise may be characterized with a Noise Amplitude Factor of one—i.e, wherein the equation $(1+NAF) \times V_{DD}$ represents the total amplitude of the signal on the supply line with the noise addition. It will be understood that the Noise Amplitude Factor (NAF) represents a relative amplitude addition or subtraction to the supply signal, wherein the NAF metric is normalized relative the typical level of the supply signal.

Figure 6:
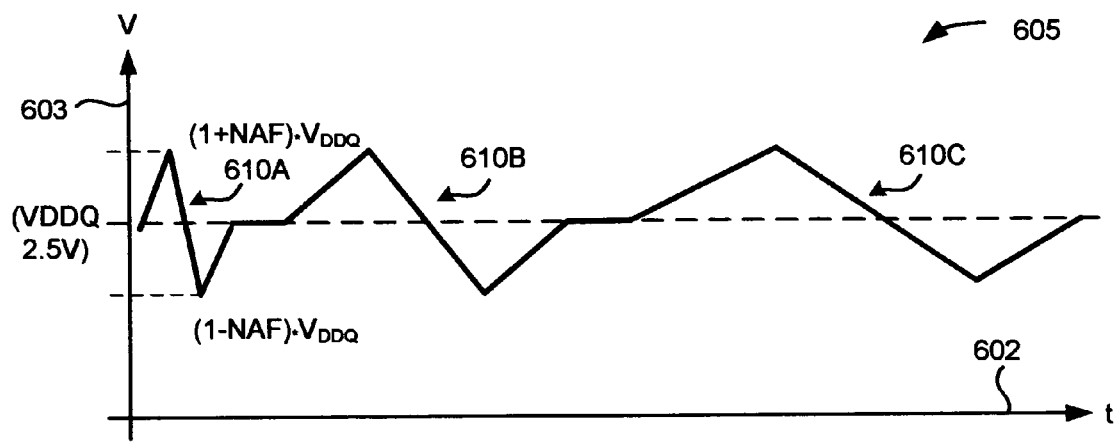
FIG. 6 is a graph illustrating an example of signal transients on a supply bus, which may be used to assist an understanding of operation of different protection circuits.

Further referencing the FIGS. 6 and 8, the noise transients 610B and 610C may be modeled with transient durations as long as 100 or 200 nS respectively.

Referencing the timing diagrams of FIG. 8, an exemplary shunting NMOS device 128 for a conventional protection circuit (e.g., 100/100B of FIGS. 1A and 1B) may be enabled the noise transient events, and may conduct current S128 for as long as 10–20 nS. Assuming an integrated circuit may comprise multiple I/O pads and a protection circuit for each pad, then it may be understood that the magnitude current leakage may be multiplied in accordance with the multiple number of protective circuits of the integrated circuit. Accordingly, the total leakage current of a integrated circuit (e.g., of 100 I/O pads) may become as large as 300 to 500 mA in some circuit conditions. Again, the leakage current for this conventional device may be described as resulting from the ramp-up signal of, e.g., a non-ESD event. It may be understood that these non-ESD event may result from, e.g., a supply power-on of a semiconductor device, or from an alternative noise source such as a transient resulting from a simultaneous switching event.

During these non-ESD events, the integrated circuit or semiconductor device may typically be coupled within an environment or application (e.g., on a circuit board) that may terminate all the I/O pads—i.e., leaving no pads floating. Furthermore, the device may be deemed capable of withstanding or accommodating (without damage) the signal levels of non-ESD events. However, as presented above, the conventional ESD protection circuit may enable the shunting device and cause it to conduct current over seemingly long duration of these non-ESD noise events. As a result, these conventional ESD protective circuits may be describes as overly leaky and wasteful of energy.

Addressing one type of non-ESD event, switching noise may comprise, for example, noise originating from the simultaneous switching of buffer circuits within an integrated circuit. The simultaneous switching of these circuits may cause sudden changes in the current demands on a supply bus. And, due to inductive characteristics of the bus, the sudden changes in current may result in the formation of noise spikes on the supply. This type of supply noise may be referenced as simultaneous switching noise (SSN).

Figure 2A:
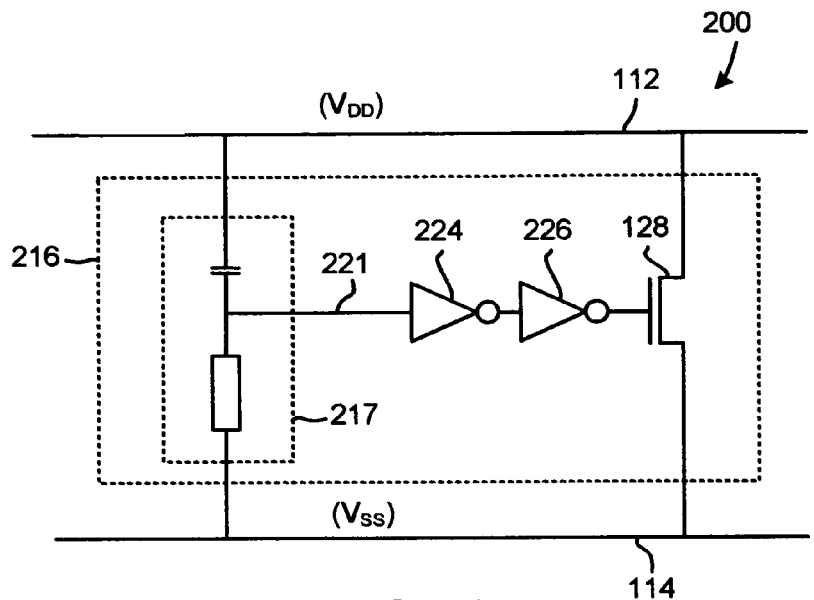
FIG. 2A is a schematic of another conventional ESD protection circuit between two supply lines, which employs a high-pass filter.
Figure 2B:
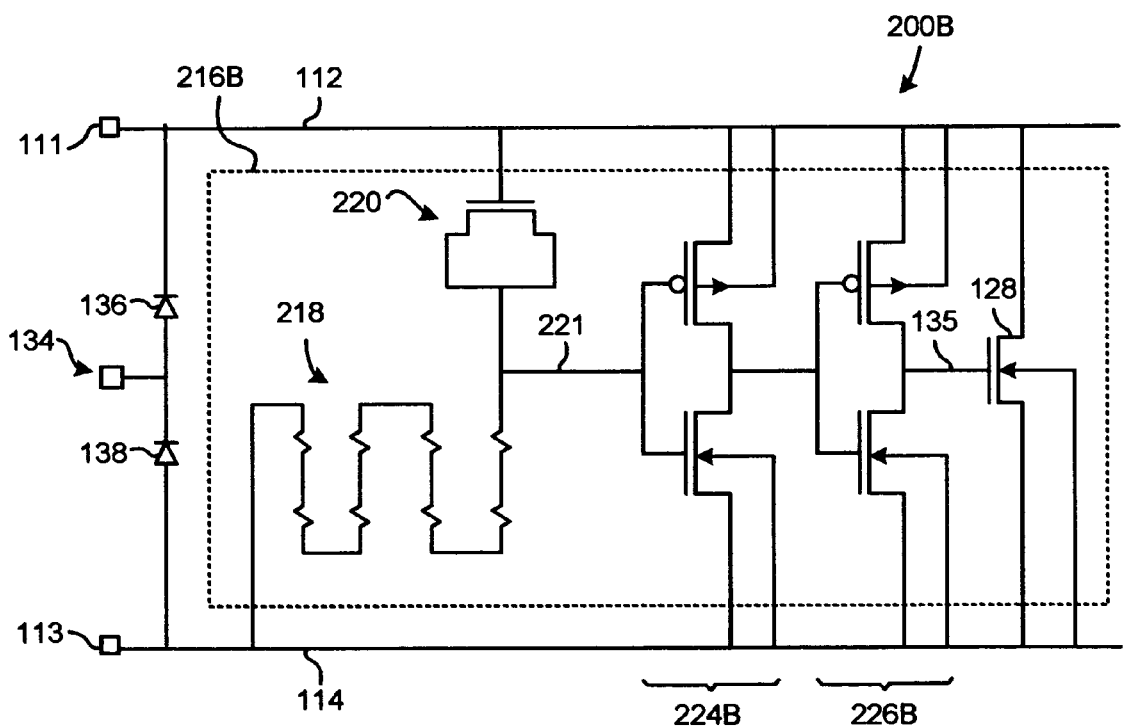
FIG. 2B is schematic a conventional ESD protection circuit of a high-pass configuration proximate an I/O interface.

Referencing FIGS. 2A and 2B, another category of ESD protection circuit to an I/O interfacing circuit 200/200B may be described as a High-Pass ESD protection circuit 216/216B. As a part of this circuit, high-pass filter 217 may be operable with a frequency response different from frequency response of the low-pass filter 117 that was previously described with reference to FIG. 1. In this example, the high-pass filter may comprise an RC circuit with a high-pass frequency transfer function for signals at node 221 relative to signals of upper bus 112. Relative to the previously described protective circuit, it may be understood that this high-pass category of protective circuit 200/200B may guard against leakage during slow ramping power-ups on the upper supply line 112.

But for more rapid transient events, node 221 may track more readily AC changes of the upper supply and may, thus, be more sensitive to switching noise. Accordingly, while the low pass protective circuit may be more effective at preventing leakage current during simultaneous switching type noise transients; the high-pass protective circuit may be more effective in preventing leakage current during slower ramping transient events.

Figure 7A:
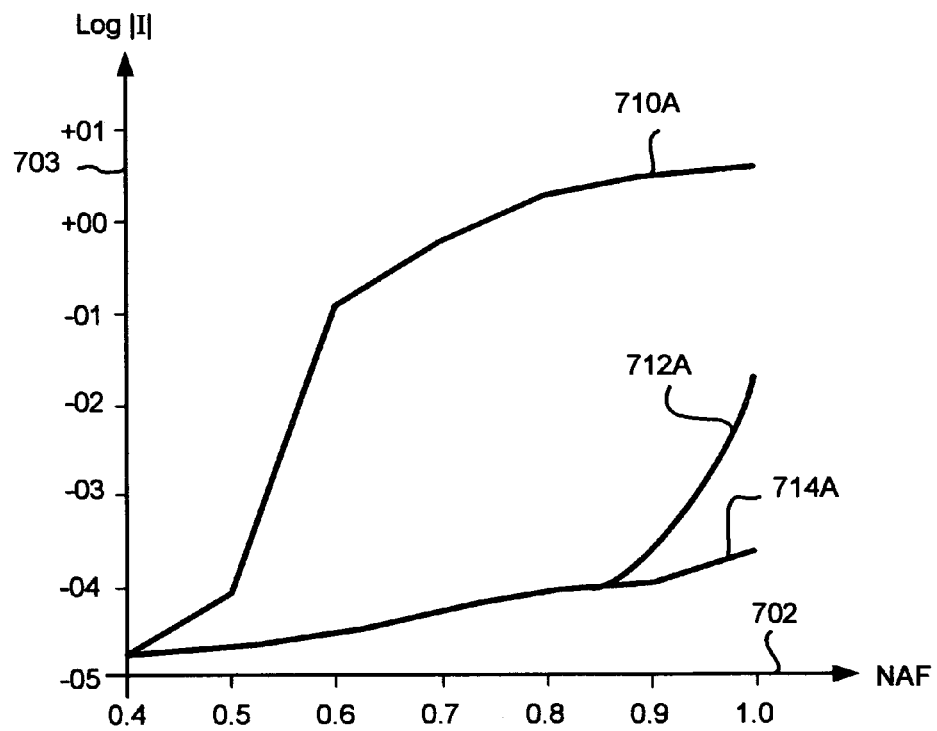
FIGS. 7A–7B are graphs showing data of leakage current during operation of two different conventional ESD protection circuits.
Figure 7B:
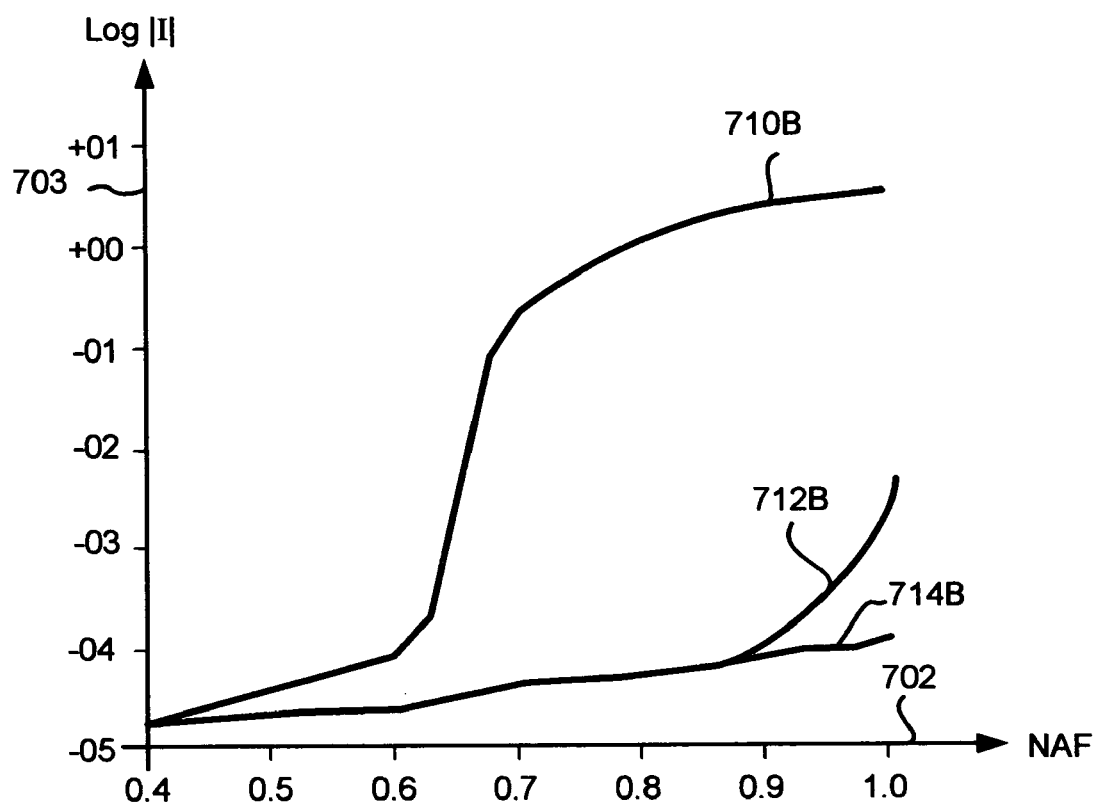

It may be shown that each may suffer difficulties of leakage current under different conditions. Referencing FIGS. 6, 7A and 7B, analysis of each of the low-pass and high-pass type ESD protection circuits may be performed using a stimulus waveform such as that of FIG. 6. In FIG. 6, supply signal 605 may be representative of a signal to be presented on the upper bus to check (or simulate) operability of protective circuits during the different types of noise events—i.e., of quick, medium and long duration transients.

Further referencing the exemplary stimulus signal 605 of FIG. 6, simultaneous switching noise (SSN) may be modeled using quick transients representations as simplistically illustrated by transient 610A. The features of such transient, in an actual circuit application, might be influenced by an inductance, capacitance and/or resistance associated with the bus. For example, its ringing frequency, spike amplitude, transient duration . . . could all be affected by the environmental considerations of the supply bus. For the stimulus signal 605, the SSN-type transient event 610A may be characterized simplistically with 10 nS rise and fall durations. Additionally, it may be modeled as comprising a NAF metric up to one.

Alternative noise or signal transient events 610B and 610C may be modeled with similar amplitudes, but of longer rise and fall durations. A bus of greater inductance and/or capacitance or alternative noise origination may result in non-ESD noise events of longer duration ramps. In such examples, transient 610B may be modeled with 100 ns rise and fall durations, while transient 610C may be modeled with 200 ns rise and fall times. Accordingly, these different duration noise transients model the various types and/or transient signals of the supply and may all be used together to assess an overall performance of the different protection circuits. Operation of the low-pass and high-pass circuits may be simulated and analyzed using this stimulus waveform 605 on the supply line. Additionally, the circuit performance levels may be assessed over a range of amplitudes (NAF) for the noise signals.

Furthermore, variances may be established to different parameters of the high-pass and low-pass type protection circuits. Such variances may be determined, in known fashion, in accordance with predetermined tolerances in their fabrication processes and also their operative temperatures and voltages. Artisans in this field may be familiar with known experimental-design, variable matrices; which may adjust the (e.g., process, temperature and voltage) variables over their various tolerance extents to test the operability of the circuits in the variety of possible conditions. As shown by simulated data results of curves 710A,712A,714A and 710B,712B,714C of FIGS. 7A and 7B respectively, each of the low-pass and high-pass protective circuits under their various variable conditions, when subjected to a stimulus signal such as that of FIG. 6, may experience leakage currents.

For a particular combination of operative parameters—i.e., process, temperature and voltage, high-pass protective circuit 216B of FIG. 2B may be vulnerable to large leakage currents when the amplitude of transients for a supply signal exceeds a given threshold. As represented by the data curve 710A of FIG. 7A, which represents the leakage current of a protective circuit under worst case condition across a range of different NAF for the noise transients. In this analysis, the high-pass protective circuit reveals a large increase in leakage current when the amplitude of the transient events for the stimulus supply signal (605 of FIG. 6) reaches a level of 0.6. Likewise, the conventional low-pass protective circuit (116B FIG. 1B) under a similar worst case operative condition, may also show an increase in leakage current (i.e., per data curve 710B of FIG. 7B) once the amplitude for the noise transients reach a NAF level of 0.7. The other curves (712 and 714) may represent how the circuits may perform under different operative conditions/parameters (process, temperature and voltage). Accordingly, it may be observed that the conventional ESD protective circuits, under certain parameters and conditions, may allow seemingly large leakage currents.

Figure 3:
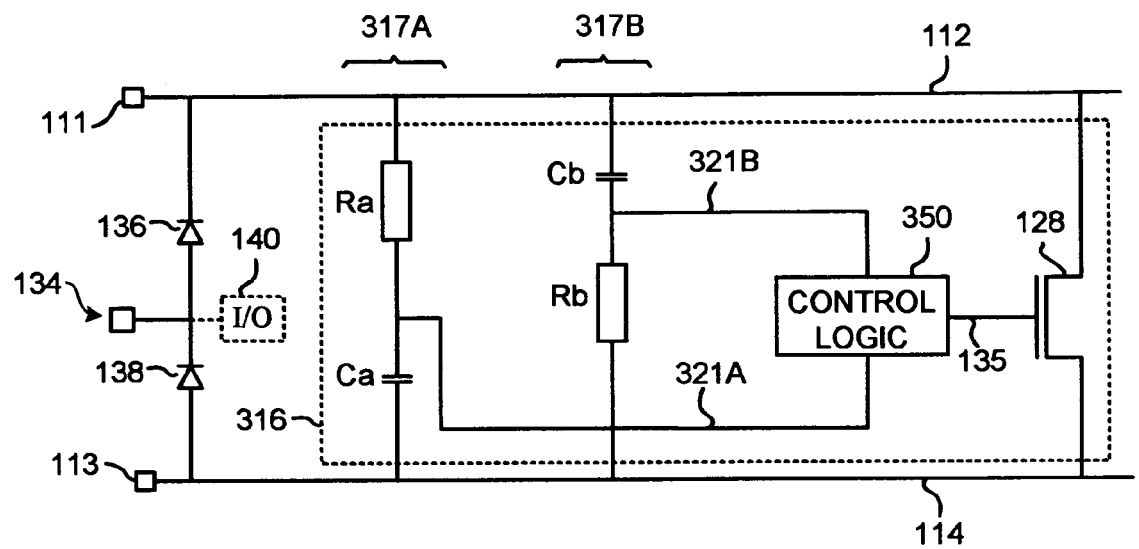
FIG. 3 is a schematic illustrating a protection circuit in accordance with an embodiment of the present invention.

In accordance with an embodiment of the present invention, referencing FIG. 3, an ESD protective circuit 316 may be operable to distinguish ESD events from non-ESD events and may guard against excessive leak current during non-ESD events.

In one embodiment, the protective circuit 316 may comprise two separate signal conditioning circuits 317A and 317B to filter signals of upper supply line 112 in accordance with two different transfer functions. The signals conditioned by the two conditioning circuits 317A,317B may be propagated to separate inputs 321A,321B respectively of control logic 350. Control logic may control operation of shunting device 128 dependent on the signals received from the conditioning circuits 317A,317B.

In a further embodiment, further referencing FIG. 3, first conditioning circuit 317A may comprise a low-pass filter. In this embodiment, a resistor and capacitor may be disposed between upper supply line 112 and lower supply line 114. The node between the resistor and capacitor may drive a first input 321A of the control logic. Second conditioning circuit 317B may comprise a high-pass filter, such as a capacitor and resistor disposed in series relationship between the upper and lower supply lines 112,114. The high-pass filter may be characterized with a high-pass response to couple high frequency AC components of supply line 112 to second input 321B of control logic. Control logic may then discern ESD events from non-ESD events dependent on the signals received at its two inputs. The time constant or frequency characteristics of the filters in combination with the threshold properties at the inputs of the control logic and associated logic thereof, may establish the criteria to discern ESD events from "non-ESD" events. In this embodiment, the control logic may enable the shunting device when receiving a high level at its input 321B and a low level at its input 321A. The control logic may alternatively disable the shunting device when either the level at input 321A is high or the level at input 321B is low.

Figure 4:
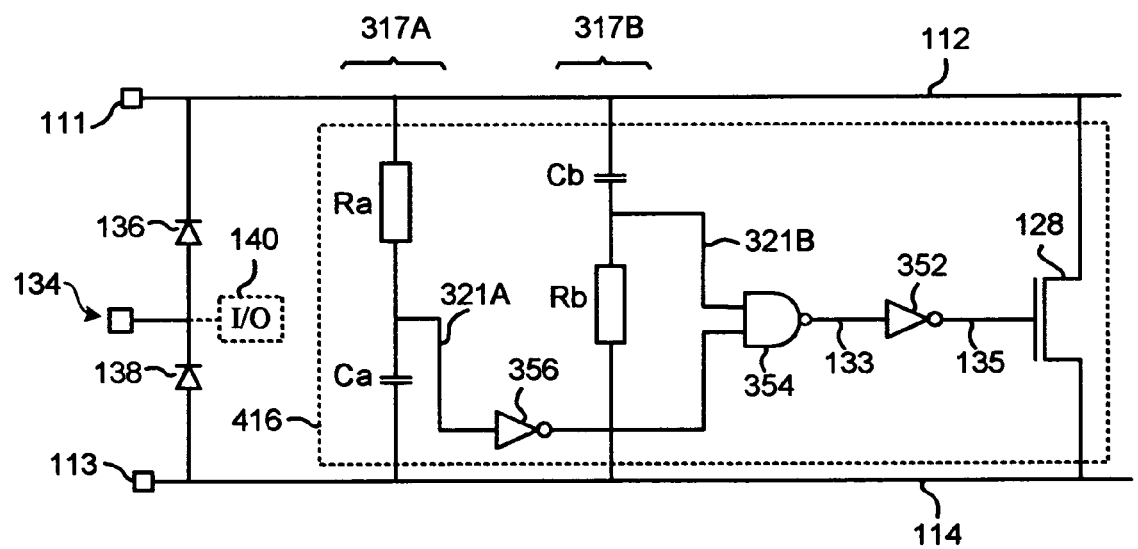
FIG. 4 is a schematic illustrating a protection circuit in accordance with an embodiment of the present invention, showing an example of logic circuitry to drive a shunting device.

In a further embodiment, further referencing FIGS. 3–4, control logic 350 may comprise an inverter 352 to drive a gate 135 of an N-channel MOSFET 128. The control logic may further comprise NAND gate 354 to control the MOSFET 128 via inverter 352. One input 321B of the NAND gate may receive the output signal of high-pass filter 317B while the other input of the NAND gate may receive the output signal from low-pass filter 317A via another inverter 356.

In one example, a time constant (RC time constant) of low-pass filter may be set to a level of about a 500 ns to 10 ms. In a particular example, the low-pass filter may be designed for a time constant of about 1 μs. However, it may be understood that alternative embodiments may comprise other levels for the time constant. Some of these alternative embodiments may define a time constant based on a level of discernment desired for distinguishing "ESD" events from "non-ESD" events.

Additionally, the input of inverter 356 and input 321B of NAND gate 354 may comprise switching thresholds that may work in combination with the time-constants of the filters to establish the discern criteria between the different events. Further, the parameters of last inverter 352 may operate with the operable parameters of MOSFET 128 to similarly refine the point within an ESD event by which to enable the MOSFET 128 for shunting current of the ESD transient.

Figure 5:
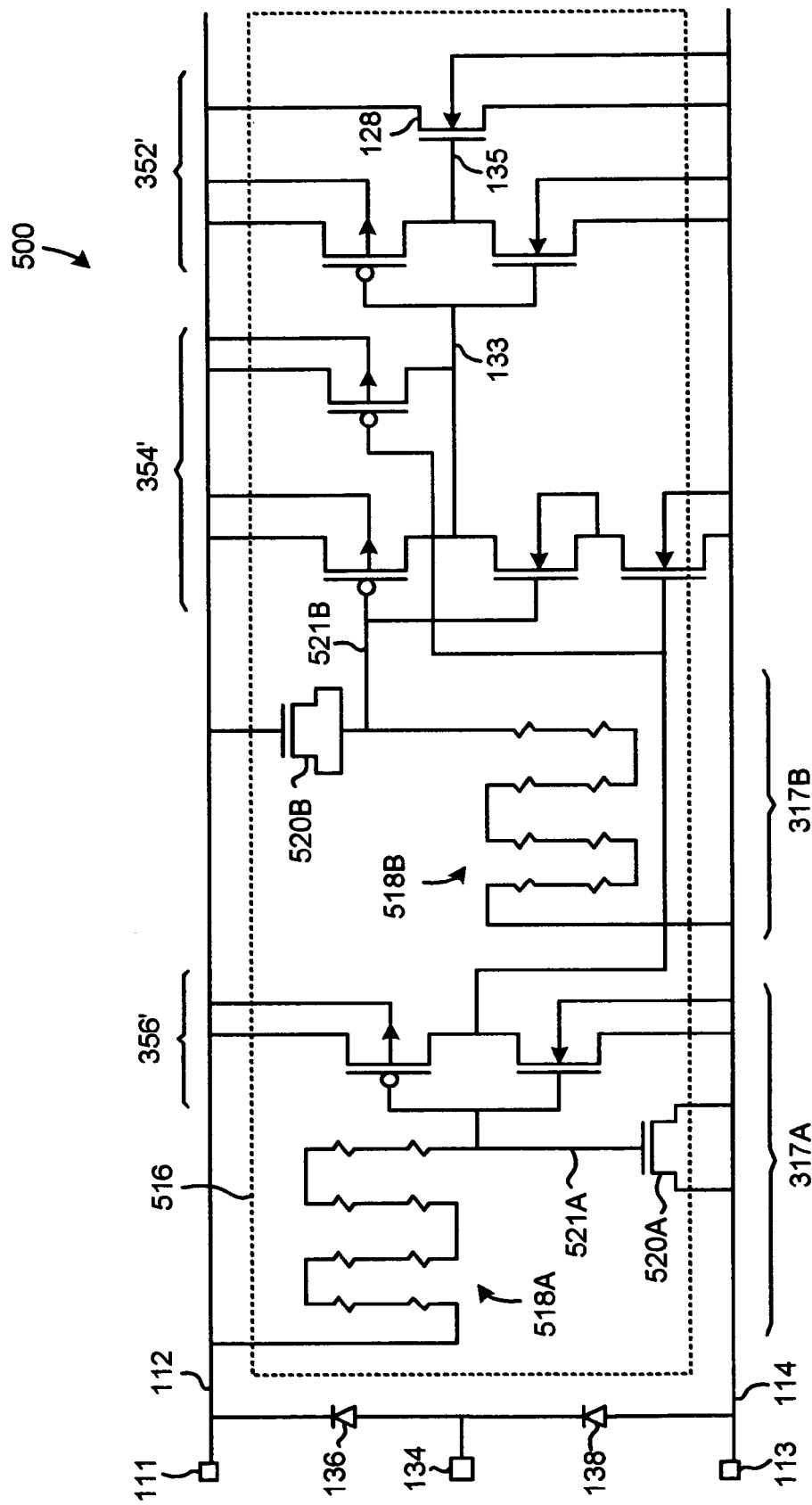
FIG. 5 is a schematic illustrating a protection circuit in accordance with another embodiment of the present invention, showing examples of conditioning circuits and MOSFET realizations to logic devices.

In a particular example, referencing FIG. 5, inverter 352' may be operable to enable the shunting MOSFET during an ESD event. In this example, inverter 352' may comprise a PMOS device in series with an NMOS device. In this context, PMOS and NMOS may reference respective P-channel and N-channel MOSFETs. Their gates may be coupled to the output of NAND gate 354'. The width/length ratio of the PMOS may be adjusted relative to the NMOS device. By adjusting their relative dimensions, the trigger point of the inverter may be defined to establish when NMOS 128 may be enabled.

In this embodiment, the width/length ratio of the PMOS may be one-half the width/length ratio of the NMOS within inverter 352'. For example, the inverter's NMOS device may be formed with a width/length ratio of 10/1.5 and the PMOS device may be formed with a width/length of about 5/1.5 (i.e., a ratio that is one-half the ratio of the NMOS device). Again, having disclosed one particular embodiment for this inverter, it may be understood that alternative embodiments may comprise MOS devices of alternative width/length ratios, which also may be operable to assist discernment of an ESD event and to enable gateable channel 128 during such ESD event.

Further referencing an embodiment of FIG. 5, NAND gate 354' may comprise known arrangement of PMOS and NMOS devices. Two PMOS devices may be coupled with their channels in parallel and respective source terminals coupled to upper supply line 112. Two NMOS devices may be disposed in series arrangement between the lower supply line 114 and the parallel coupled PMOS devices. In one embodiment, the PMOS devices may comprise width/length ratios of 10/1.5 while the series coupled NMOS devices may comprise width/length ratios of 10/1.5. Again, alternative embodiments may comprise different ratios, which may also be remain operable with inverter 352' and gateable channel 128 to assist discernment of an ESD event and be operable to enable gateable channel 128 during such ESD event.

Low-pass and high-pass filters 317A,317B, further referencing FIG. 5, may comprise respective resistive elements 518 and capacitors 512. In this embodiment, the resistive elements and capacitors may comprise similarly designed devices. The resistive element 518 may comprise a serial sequence of polysilicon squares (e.g., non-silicide poly segments disposed in series) and capacitor 520 may comprise a thick gate-oxide MOS device having S/D regions joined to the respective supply line and the gate of the MOS device coupled to the last poly segments making up the resistive element 518.

The node between resistive element 518A and capacitor 520A of low-pass filter 317A may drive input 521A of inverter 356'. In other words, the output of the low-pass filter may drive the gates the PMOS and NMOS devices associated with inverter 356'. For this embodiment, the first inverter may comprise PMOS and NMOS devices of similar width/length ratios (e.g., 10/1.5). In alternative embodiment, these width/length ratios may be different.

For the high-pass filter 317B, its output node intermediate capacitor 520B and resistive element 518B may drive one of the inputs 521B of NAND gate 354'. The gate to one of the parallel coupled PMOS devices of the NAND gate and the gate to one of the series coupled NMOS devices of the NAND gate may each be coupled to receive the output signal of the high-pass filter.

Operation of the protection circuit may be simulated under different categories of transient events. One type of transient event may be referenced as an ESD event. For example, static charge from a known human body model (HBM) may discharge to a pin/pad of a semiconductor device for an embodiment of the present invention. The signal resulting from the ESD event and may be understood to reach one of the supply lines associated with the semiconductor device. When a signal of an ESD event should reach upper supply lines 112, it may then be distributed to other supply lines 114 using protection circuits such as those of protection circuits 316,416 and 516.

Further embodiments of semiconductor devices may further comprise conventionally known, back-to-back parallel-coupled, also known as "anti-parallel", clamping diodes (not shown) between the supply lines associated with same supply levels. In operation, when a voltage on one of these supply lines (of a given supply such as Vdd) should exceed the voltage on another supply line of the same supply (e.g., Vdd), one of the diodes of the back-to-back parallel-coupled arrangement may conduct current to distributed charge of excess signal to the other supply lines. Additionally, another conventionally known clamping circuit may be employed with this semiconductor device embodiment, and may comprise diodes (not shown) disposed for reverse bias arrangement between upper supply lines and lower supply lines. Should a lower supply line receive a voltage level that may exceed that of the upper supply line, then one of such diode may conduct current from the lower supply line to the upper supply.

Continuing description of operation of the protective circuit during an ESD event, referencing FIG. 5, upper supply line 112 may channel the transient signal from the ESD event to the sources of the PMOS devices of NAND gate 354' and also to the drain of N-channel MOSFET 128.

Assuming that the semiconductor device is in an isolated condition (i.e., before it has been assembled into a printed circuit board, or other electrical circuit application), the interfacing pins/pad of the integrated circuit and its internal nodes may each be assumed initially biased with a ground potential relative to the transient event. According, it may be understood and shown that the PMOS devices of inverter 352' may be enabled during the ESD event. When enabled, the PMOS device of inverter 352' may conduct current to gate 135 of NMOS device 128, which in turn may then enable the shunting device 128 to shunt current of the ESD transient.

For a non-ESD event and assuming the integrated circuit in a biased operable condition, low pass filter 317A may initially supply a Vdd level signal to input 521A of inverter 356'. Accordingly, inverter 356' may initially output a low level signal to input 357 of NAND gate 354'. If the transition rate of the transient is within the responsiveness of the low pass filter, then the inverter 356' may continue to receive a high input and may keep the node 357 to the NAND gate low. Accordingly, NAND gate may output a high level and inverter 352' may be operable to keep the N-channel MOSFET disabled. It may similarly be seen that a power-up event of the semiconductor device may operate the protection circuit similarly, where the ramp rate of the supply signal is within the responsiveness of the low pass filter.

For an alternative non-ESD transient condition, such as an event resulting from simultaneous switching, it may be assumed that the transient may comprise a rise-time or transition rate that is faster than the response time of low-pass filter 317A. Accordingly, as the signal of upper supply line ramps upward, the NMOS and PMOS devices of inverter 356' may effectively be operable as a resistor divider network to provide an output level based upon their biasing and design parameters.

Additionally, assuming the initial powered condition of the integrated circuit, it may be understood that the high-pass filter may initially present a low level to input 521B of NAND gate 354'. This low level may initially enable one of the PMOS transistors and disable one of the NMOS devices, and the NAND gate may send a high level to inverter 352'. Once a transient is received on the upper supply, node 521B at the output of the high-pass filter may carry an output signal with a slope that tracks the slope of the transient. This output signal from the high-pass filter, however, may comprise an offset of, e.g., $V_{dd}$. One input to the NAND gate may receive this level, which may slightly enable one of the series NMOS devices of the NAND gate.

Likewise, the low-pass filter in combination with the inverter 352' may also slightly bias the other NMOS device of the NAND gate. Accordingly, the output level of the NAND gate may drop slightly and inverter 352' may slightly increase its output signal at the gate 135 of shunting device 128. Dependent upon the previously described width/length ratio designs for the NMOS device and the PMOS device of inverter 352', the inverter may be operable to enable the large shunting device 128, but only momentarily. The time constants of the low-pass filter and the high-pass filter in combination with the switching points of the logic circuits may be designed to control this amount of time that the shunting device 123 is momentarily enabled.

In accordance with one embodiment, these time-constants and switching points may be set to establish a control time ($T_{CNTRL}$) for the protection circuit in response to a power-up sequence of less than 10 μs. In accordance with another embodiment, these parameters are set to establish a control time of less than 1 μs. The power-up event can be characterized by the time $T_{pwr}$ taken for the product supply voltage to be ramped from an initial voltage of zero up to its final voltage, e.g., $V_{DD}$, to be used during product operation. If $T_{pwr}$ is too short, the shunting device may be enabled for a brief duration as may be established by parameters of the filters and logic devices. Yet, during this momentary interval, It may be shown that a current flow through the shunting device may remain less than tens of micro-amps (µA). In certain embodiments, the current level through the shunting device during such momentary enablement during the 1 µs duration may be kept to a magnitude of less than 5 µA, even for a power-up sequence having a duration $T_{pwr}$=10 µs.

Figure 9:
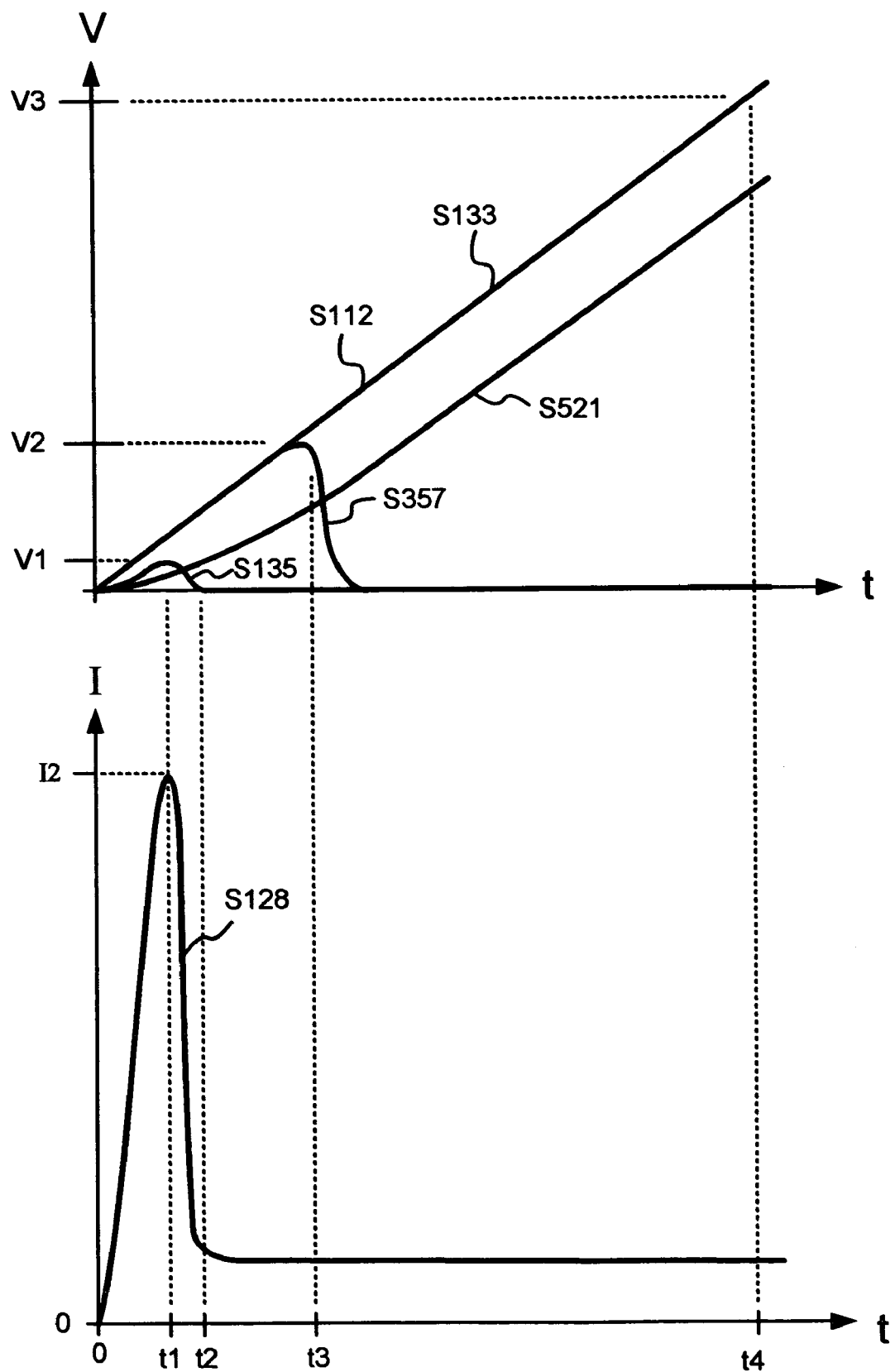
FIG. 9 is a graph of voltage signals and a current signal for an example of operating a protection circuit in accordance with an embodiment of the present invention.

In one example of a power-up event, as a type of non-ESD event, referencing FIGS. 5 and 9, a supply signal S112 may be present to the supply line 112 of an initially un-biased semiconductor device or integrated circuit 500, which may comprise ESD protection circuit 516. For purposes of describing one example of operation, supply signal S112 may be characterized with a voltage level that ramps from 0 to V3 (e.g. 2.5 Volts) over a transient duration Tpwr of 10 µs.

Noting that all nodes, in the original powered-down condition, initial carry low level voltages, it may be recognized that each of the PMOS devices may initially begin with gates biased with these low level voltages. Accordingly, PMOS device of inverter 356' may initially be biased ON; along with the PMOS device of inverter 352'. The enabled PMOS of inverter 352' may then increase the voltage level (S135 in FIG. 9) at gate 135 of NMOS device 128 during initial ramping of the upper supply signal. As the signal S135 increases at the gate of the NMOS, this shunting device may eventually turn-on. The point at which it may begin to turn-on may be based upon the threshold voltage characteristics of NMOS 128.

Likewise, the initially enabled PMOS of inverter 356' may pass the voltage of supply line 112 as signal S357 to be presented to input 357 of NAND gate 354'. It may be noted that the high-pass filter 317B may pass the transient (AC components) of supply signal S112 to the remaining input 521B of the NAND gate. Accordingly, the PMOS device of the NAND gate to receive this signal from the high-pass filter will remain off during the supply power-up.

With the signal S357 at the input 357 to NAND gate 354' initially tracking the upper supply signal, it may be noted that enabled PMOS devices of the NAND gate will couple the upper supply signal 112 to the input 133 of inverter 352'. Thus, the signal S133 at the input 133 of the inverter may follow the level of the ramping supply signal S112.

The low pass filter, may output a signal S521 that may be described, essentially, as a delayed representation of the supply signal. The time constant of the low-pass filter may establish the rate at which output signal ramps upwardly.

Further referencing FIGS. 5 and 9, at around time t1, the level of signal S133 at the input of inverter 352' exceeds the turn-on threshold of the inverter's NMOS device. At this point, the inverter output may discharge the gate terminal 135 (as represented by signal S135) and disable the shunting NMOS device 128. As the NMOS device is disabled, the current S128 through the device will be terminated (i.e., between time t1 and t2). In accordance with one embodiment, this control time may be kept as low as 1 µS as determined by the trigger point of inverter 352' and the time constant to node 133 as established by the PMOS devices of NAND gate 354' and the capacitance of the node 133. Subsequently in time, at time t3, inverter 356' receives signal S521 from the low pass filter of a level sufficient to trigger its output state. At this point, the signal S357 at the input of NAND gate 354' transitions from a level that tracks the supply signal, to a low level.

In this example, the shunting N-channel MOSFET 128 may be enabled momentarily and may be turned-off within a period of about 1 microsecond after it has been turned on. Additionally, the leakage current through the device may be kept small, given the short duration that it is enabled and the low levels of the supply signal during this period. In this embodiment, the current amplitude may be kept less than 10 microamps. In a further embodiments, the leakage current may be kept less than 5 microamps.

In another embodiment, a protection circuit (e.g., 516 of FIG. 5) of the previously described embodiments may be associated with each I/O pad of an integrated circuit. Assuming an integrated circuit with 100 I/O pads, it may be seen that the total leakage current of the device during non-ESD events may be kept less than 500 µA during power-up—i.e., 100 times 5 µA per protection circuit.

Figure 7C:
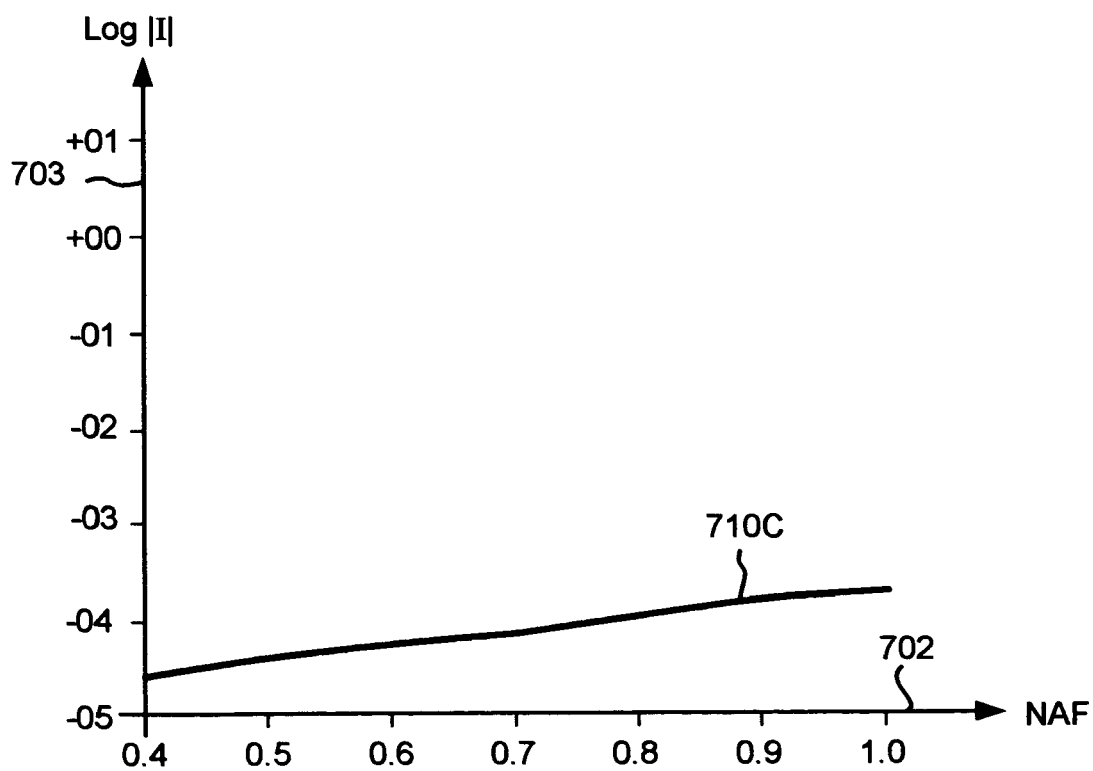
FIG. 7C is a graph showing data of leakage current during operation of an ESD protection circuit for an embodiment of the present invention.

Referencing FIGS. 5, 6 and 7C, operation of protective circuit 516 for an embodiment of the present invention may be simulated using signal 605 as a stimulus signal on upper supply line 112. The simulation may be preformed for the transients at various amplitude levels (NAF). As shown by the data curve 710C of FIG. 7C, resulting leakage current through shunting device 128 may be kept small for the non-ESD transient events of stimulus signal 605 and over a variety of different noise amplitude levels.

While certain exemplary features of the embodiments of the invention have been illustrated and described herein, many modifications, substitutions, changes and equivalents may now occur to those skilled in the art. It is, therefore, to be understood that the appended claims are intended to cover all such embodiments and changes as fall within the spirit of the invention.

What is claimed is:

1. An ESD protection circuit, comprising:
   a first line to carry a supply signal;
   a second line to carry another supply signal different from that of the first line;
   a gateable channel disposed between the first and second lines, the gateable channel comprising a N channel MOSFET having its channel disposed between the first and the second lines, and a gate to receive a voltage bias to affect a conductivity of the channel;
   a first filter of a low-pass frequency response of given cut-off frequency to receive a signal of the first line and to filter the signal to establish a first output signal;
   a second filter of a high-pass frequency response of a corner frequency greater than the given cut-off frequency for the low-pass frequency of the first filter, the second filter to receive and filter the signal of the first line to establish a second output signal; and
   logic circuitry to enable the gateable channel based on the first output signal and the second output signal;
   wherein the first and the second filters of the respective high-pass and the low-pass frequency responses in combination with the logic circuitry to distinguish different slew-rate transients operable to
   discern an ESD event from a non-ESD event,
   drive the gate of the N-channel MOSFET with a first level dependent upon determining an ESD event,
   drive the gate with a second level different from the first level dependent upon determining a non-ESD event,
   enable the channel of the N-channel MOSFET when the first output signal is below a first predetermined threshold and the second output signal exceeds a
second predetermined threshold, and
disable the channel of the N-channel MOSFET when
the first output signal exceeds the first predetermined
threshold; and
wherein the logic circuitry comprises:
an inverter to drive the gate of the N-channel MOSFET; and
a NAND gate to drive the inverter based on the first and the second output signals.

2. The circuit according to claim 1, in which the logic circuitry is operable to disable the gateable channel of the N-channel MOSFET when it determines a non-ESD event based on the first and the second output signals.

3. The circuit of claim 1, in which
the NAND gate comprises at least first and second inputs;
the first and second inputs of the NAND gate to be driven based on the first and second output signals respectively; and
the logic circuitry further comprises a second inverter to invert the first output signal and to drive the first input of the NAND gate with the first output signal inverted.

4. The circuit according to claim 3, in which the logic circuitry is further operable to enable the gateable channel of the N-channel MOSFET when it determines an ESD event based on the first and the second output signals.

5. The circuit of claim 3, in which the second inverter comprises a tripping point defining the first threshold level; and the NAND gate comprises a tripping point defining the second threshold level.

6. The circuit of claim 1, in which the first filter of the low-pass frequency response comprises a characteristic time constant of magnitude less than a predetermined power-up time constant for the supply bus for the first line.

7. The circuit of claim 1, in which the first filter of the low-pass frequency response comprises a characteristic time constant of magnitude substantially greater than the ramp-up duration of a human body modeled ESD transient.

8. The circuit of claim 1, further comprising a diode comprising a cathode coupled to the first line and an anode coupled to the second line.

9. The circuit of claim 1, further comprising:
an I/O pad; and
first and second clamping devices between the I/O pad and the respective first and second lines.

10. The circuit of claim 9, in which each of the clamping devices comprises a diode.

11. A semiconductor device comprising:
a controllable shunting device selectably operable to shunt a signal of an ESD event between first and second supply buses;
a first conditioning circuit to receive and condition a signal of the first supply bus in accordance with a low-pass frequency response;
a second conditioning circuit to receive and condition a signal of the first supply bus in accordance with a high-pass frequency response; and
a control logic to operate the controllable shunting device based on the signal conditioned by the first conditioning circuit of the low-pass frequency response and the signal conditioned by the second conditioning circuit of the high-pass frequency response;
in which the control logic comprises:
a NAND circuit to receive the respective signals processed by the first and second conditioning circuits, and generate an output signal based on a NAND operative of the signals received; and
an inverter to invert the output signal of the NAND circuit and enable the controllable shunting device based on the inverted output signal of the NAND circuit.

12. The device of claim 11, in which the first conditioning circuit comprises a high-pass filter to filter per the high-pass frequency response the signal of the first supply line relative to the second supply line.

13. The device of claim 12, in which the second conditioning circuit comprises a low-pass filter to filter per the low-pass frequency response the signal of the first supply line relative to the second supply line.

14. The device of claim 11, in which the control logic further comprises another inverter to receive and invert the signal conditioned by the first conditioning circuit and to drive an input of the NAND circuit with the inverted signal.

15. The device of claim 11, in which
the controllable shunting device comprises a transistor having a gateable channel disposed between the first and second buses; and
the inverter comprising a PMOS having a source coupled to the first supply bus and a gate coupled to receive the output signal of the NAND circuit, the inverter via the PMOS to enable the transistor based on at least one of the signal of the first supply bus and the output signal of the NAND circuit.

16. The device of claim 15, further comprising:
a pad;
a first diode between the pad and a first supply bus; and
a second diode between the pad and a second supply bus.

17. The device of claim 11, in which the inverter comprises:
a P-channel MOSFET and an N-channel MOSFET disposed with their channels electrically in series between the first and second supply buses;
gates of the N and P-channel MOSFETs coupled to receive the output signal of the NAND circuit; and
drains of the N- and P-channel MOSFETs to drive the controllable shunting device.

18. The device of claim 15, in which the first conditioning circuit comprises a resistive element and a capacitor disposed serially between the first and second supply busses, and an intermediate node between the resistive element and capacitor to drive a first input of the NAND circuit.

19. The device of claim 18, in which the second conditioning circuit comprises a capacitor and a resistive element disposed serially between the first and second supply buses, and an intermediate node therebetween to drive a second input of the NAND circuit.

20. The device of claim 19, in which the first conditioning circuit further comprises an inverter to receive and invert a signal of the intermediate node and to drive the second input of the NAND circuit with the inverted signal.

21. An integrated circuit comprising:
a plurality of pads to interface the integrated circuit;
first and second supply buses coupled to first and second pads respectively of the plurality;
a MOSFET selectively operable to short the first and the second supply buses; and
a discrimination circuit to discern such ESD event from non-ESD events, and enable the MOSFET dependent on the discernment;
in which the discrimination circuit comprises:
a low-pass filter coupled to the first supply bus to receive and filter a signal of the first supply bus per a low-pass frequency response;

a high-pass filter coupled to the first supply bus to receive and filter a signal of the first supply bus per a high-pass frequency response; and control circuitry to determine such ESD event and drive the MOSFET based on the signal filtered by the low-pass filter and the signal filtered by the high-pass filter;

in which the low-pass filter comprises a frequency response characterized with a time-constant substantially less than a time-constant associated with a non-ESD event of the first supply bus when the first supply bus is initially in an un-powered state; and the high-pass filter comprises a transfer function to attenuate frequency components of a power-up event on the first supply bus.

22. The circuit of claim 21, in which the discrimination circuit is operable to discern at least one of power-up and noise events on the first supply bus as a non-ESD event.

23. The circuit of claim 21, in which the low-pass filter comprises a time constant less than that of a voltage ramp-up for the first supply bus and greater than that of a human model electrostatic discharge event.

24. The circuit of claim 21, in which the low-pass filter comprises a time constant of at least 500 nS.

25. The circuit of claim 21, further comprising a plurality of I/O circuits, each I/O circuit comprising:

an I/O pad of the plurality of pads;

first and second clamping diodes disposed electrically between the I/O pad and respective first and second supply busses; and to one of the MOSFET and the discrimination circuit proximate respective ones of the I/O pads.

* * * * *